(12) United States Patent
Tien et al.

(10) Patent No.: US 6,329,293 B1
(45) Date of Patent: Dec. 11, 2001

(54) METHOD FOR CLEANING A POLYMER

(75) Inventors: Yu-Chung Tien; Song-Ping Tsai, both of Hsinchu (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 09/201,540

(22) Filed: Nov. 30, 1998

(30) Foreign Application Priority Data

Jun. 9, 1998 (TW) .............................. 87109185 A

(51) Int. Cl.$^7$ .................................. H01L 21/3065
(52) U.S. Cl. ................... 438/706; 438/710; 438/712; 438/714; 438/715
(58) Field of Search .................. 438/706, 710, 438/712, 745, 906, 427; 156/643; 134/1, 1.1, 1.2; 437/975

(56) References Cited

U.S. PATENT DOCUMENTS

| | | | |
|---|---|---|---|
| 4,343,677 | * | 8/1982 | Kinsbron et al. ............... 156/643 |
| 5,348,619 | * | 9/1994 | Bohannon et al. .............. 156/664 |
| 5,688,410 | * | 11/1997 | Kajitani et al. ................. 216/64 |
| 5,744,402 | * | 4/1998 | Fukazawa et al. .............. 438/734 |
| 5,759,921 | * | 6/1998 | Rostoker ......................... 438/711 |
| 5,908,735 | * | 6/1999 | Kim et al. ....................... 430/329 |
| 5,933,759 | * | 8/1999 | Nguyen et al. ................. 438/700 |

* cited by examiner

Primary Examiner—Robert Kunemund
Assistant Examiner—Lan Vinh
(74) Attorney, Agent, or Firm—Greer, Burns & Crain, Ltd

(57) ABSTRACT

A method for cleaning a polymer in a trench produced by a dry anisotropic etching process is disclosed. The method includes steps of introducing a gas into a trench for reacting with the polymer to form a volatile substance and removing the remaining polymer in the trench by a wet etching process. The gas is preferably a gaseous hydrofluoric acid to clean the polymer. Because the gas can enter the small hole of the deep trench easily, this method can completely remove the polymer in the trench.

13 Claims, 6 Drawing Sheets

METHOD FOR CLEANING A POLYMER

FIELD OF THE INVENTION

The present invention relates to a semiconductor manufacturing process, and more particularly to a method for cleaning a polymer that is produced in an etching process.

BACKGROUND OF THE INVENTION

In the semiconductor manufacturing process, a deep trench has been widely used in devices, such as when manufacturing a capacitor of a dynamic random access memory (DRAM) unit. FIG. 1 includes steps of manufacturing the deep trenches applied to a capacitor of a DRAM unit. In FIG. 1(a), a dielectric layer 11 is formed on a silicon substrate 10 and is usually made of silicon dioxide/silicon nitride/silicon dioxide or just silicon dioxide. This dielectric layer is used as a hard mask for a subsequent etching process. The dielectric layer 11 is patterned by a photolithography and an etching process. In FIG. 1(b), a photoresist layer 12 is formed on the dielectric layer 11 and a pattern is defined on photoresist layer 12 by a photolithography process. A window of hard mask 13 on the dielectric layer 11 is formed by a dry anisotropic etching process, then the pattern is transferred to the silicon substrate 10 after removing the photoresist layer 12 as shown in FIG. 1(c). Thereafter, the part of the silicon substrate 10 which is not covered by the hard mask is etched by another dry etching process to obtain a deep trench as shown in FIGS. 1(d) and 1(e).

However, an oxide-rich-polymer 14 will remain at the sidewalls and the bottom of the trenches during the dry etching process. In order to remove this polymer, a wet etching process is commonly used. A buffer oxide etcher (BOE) containing a mixture of hydrofluoric acid and ammonium fluoride is used as an etching agent for the wet etching process. However, the polymer deposition may be changed due to the poor quality of the BOE buffer, the changed chamber condition of the dry etching process, the performance of the spin dryer in the wet etching machine, or a reduced size of the deep trench, resulting in that the BOE solution can not enter the bottom of the deep trench easily. Therefore, the polymer in the bottom of the deep trench can not be removed completely by the wet etching process.

After cleaning the deep trench, another dielectric layer is formed on the silicon substrate and then the trenches are filled with polysilicon or α-silicon, as shown in FIG. 2. If the polymer in the trench is not removed completely, it will influence the quality of the dielectric layer so that the capacitance of the cell will be reduced or a current leakage will occur. Furthermore, the polysilicon or α-silicon will not fill the trench very well resulting in an occurrence of a void or a seam on the sidewall, poor quality of DRAM, or even a decreased yield of DRAM.

Because the size of the semiconductor device will be minimized, the hole size of the trench of a capacitor in a DRAM unit becomes smaller, the ratio of hole size (0.35 μm) to depth (7 μm) is 1:20 generally, and it becomes harder to clean the polymer in such a small hole of the trench by a wet etching process. For the above reasons, it is desirable to develop a method to improve the defects of the prior art. It is attempted by the applicant to develop such a process.

SUMMARY OF THE INVENTION

A major object of the present invention is to provide a method for cleaning a polymer formed in a trench of a semiconductor.

The process for removing a polymer formed in a trench according to the present invention includes the steps of introducing a gas into the trench for reacting with the polymer to form a volatile substance and removing the polymer remaining in the trench.

In accordance with the present invention, the deep trench is produced by steps as follows. First, providing a silicon substrate, then forming a dielectric layer on the silicon substrate to serve as a hard mask, and forming a photoresist layer on the dielectric layer. Etching a portion of the photoresist layer to expose a portion of the hard mask and removing the exposed hard mask to expose a corresponding portion of the silicon substrate. Finally, removing the photoresist layer remaining on said dielectric layer and removing the exposed portion of the silicon substrate to form the trench. The exposed portion of the silicon substrate is removed by a dry anisotropic etching process.

The gas for cleaning the polymer is a gaseous hydrofluoric acid and is applied to the trench to react with the polymer for 15 seconds at room temperature and 1 atm. The remaining polymer is removed by a wet etching process using a buffer oxide etcher (BOE) as an etching agent which containing hydrofluoric acid and ammonium fluoride.

In the prior art, the method for cleaning the polymer is just a wet etching process. The buffer oxide etcher (BOE) of the wet etching can not enter or be removed from the trench easily so that it becomes more difficult to completely remove the polymer at the bottom of the deep trench. In the present invention, a gaseous hydrofluoric acid is applied to the trench to clean the polymer and then a wet etching process is performed to remove the remaining polymer in the trench. Because the gas can enter the small hole of the deep trench easily, this method can solve the problem encountered in the prior art, and can effectively improve the quality of a DRAM and increase the yield of the product.

The present invention will be illustrated in details with reference to the accompany drawings, in which:

DETAILED DESCRIPTION OF THE PREFERRED EMBODIMENTS

Please refer to FIG. 3 which are schematic diagrams showing a preferred embodiment of a process for manufacturing a trench of a capacitor in a DRAM unit according to the present invention.

Figure 1A:
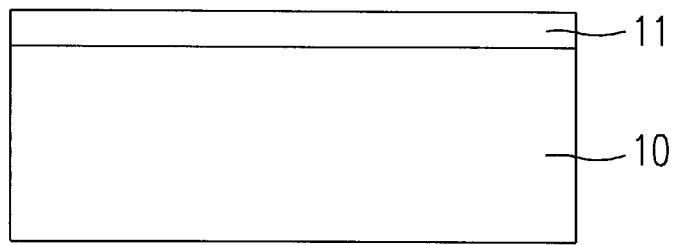
FIGS. 1(a)–1(e) are schematic diagrams showing a process for manufacturing a trench of a capacitor in a DRAM unit according to the prior art.
Figure 1B:
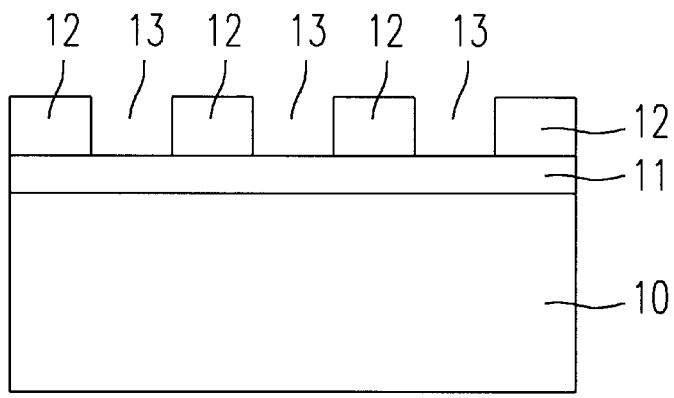
Figure 1C:
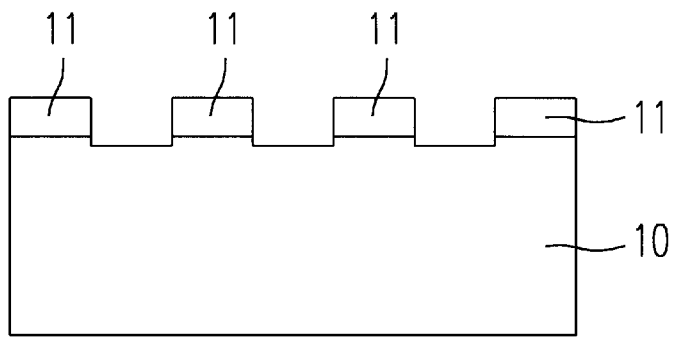
Figure 1D:
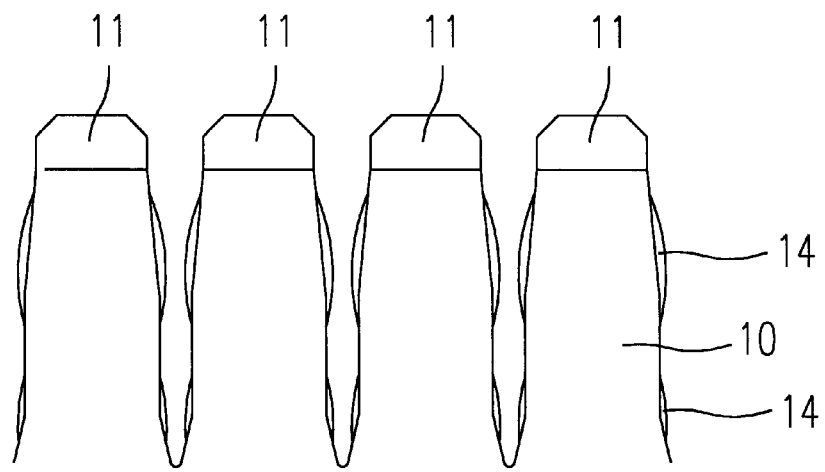
Figure 1E:
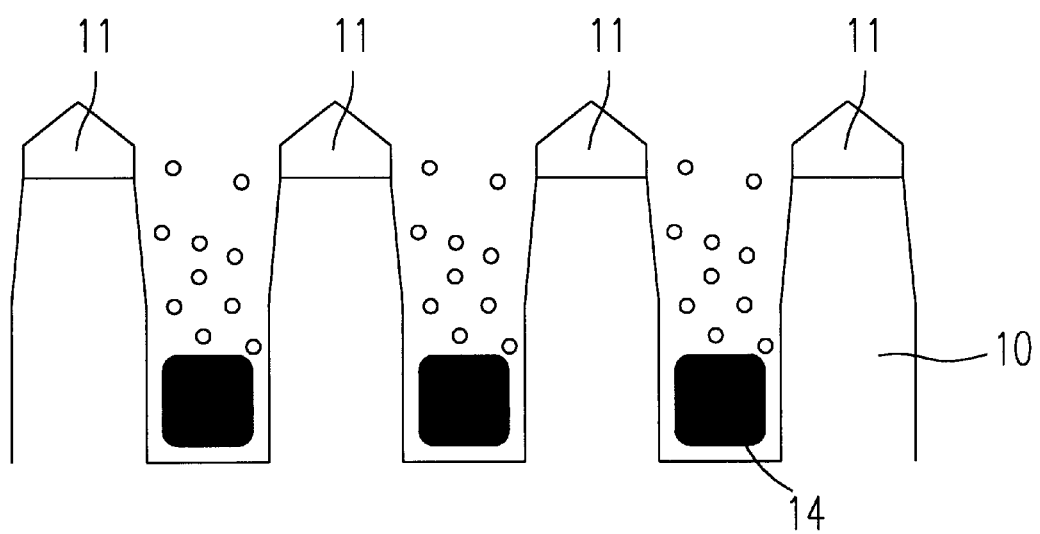
Figure 2:
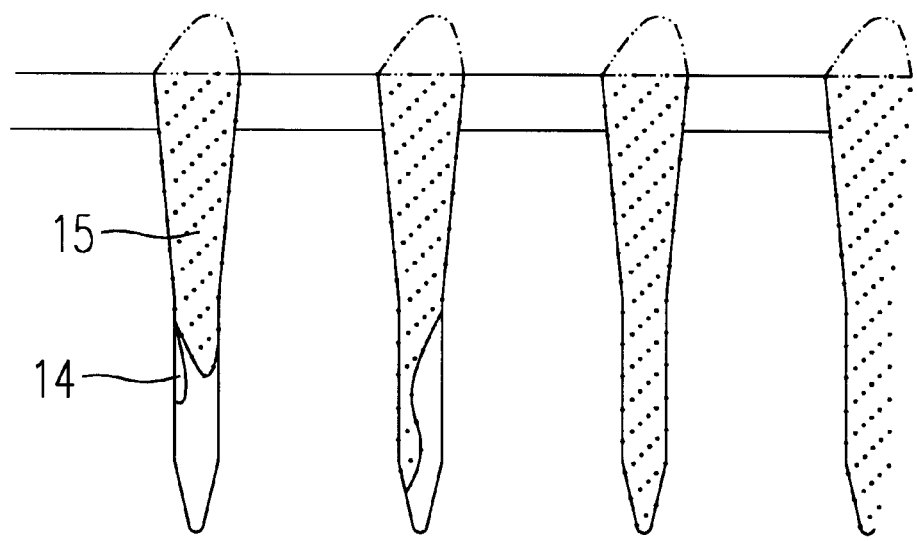
FIG. 2 illustrates the poor quality of the dielectric layer and the conducting layer in a capacitor when the polymer is not completely removed.
Figure 3A:
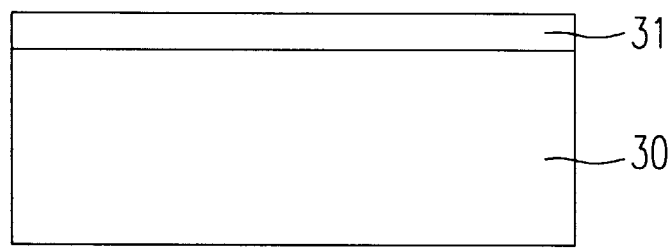
FIGS. 3(a)–3(g) are schematic diagrams showing a preferred embodiment of a process for manufacturing a trench according to the present invention.
Figure 3B:
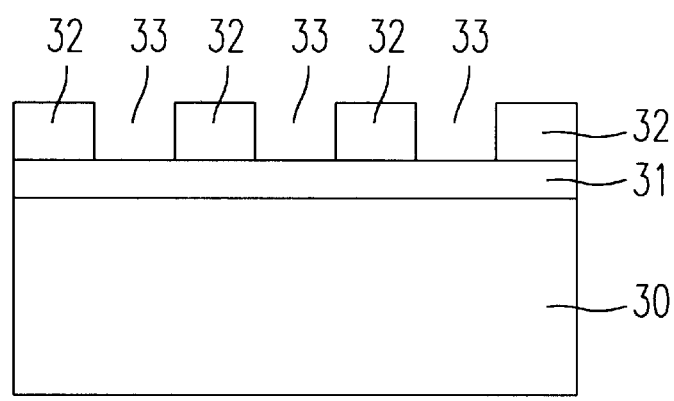
Figure 3C:
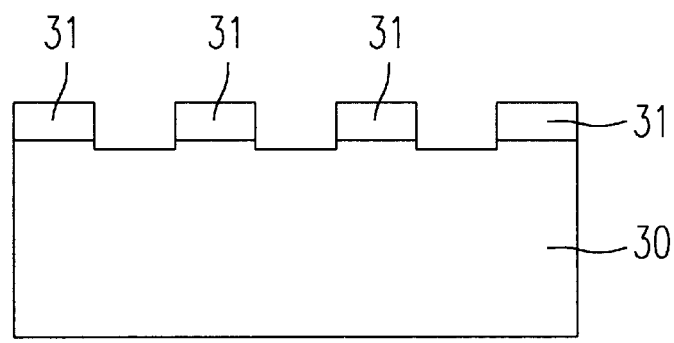
Figure 3D:
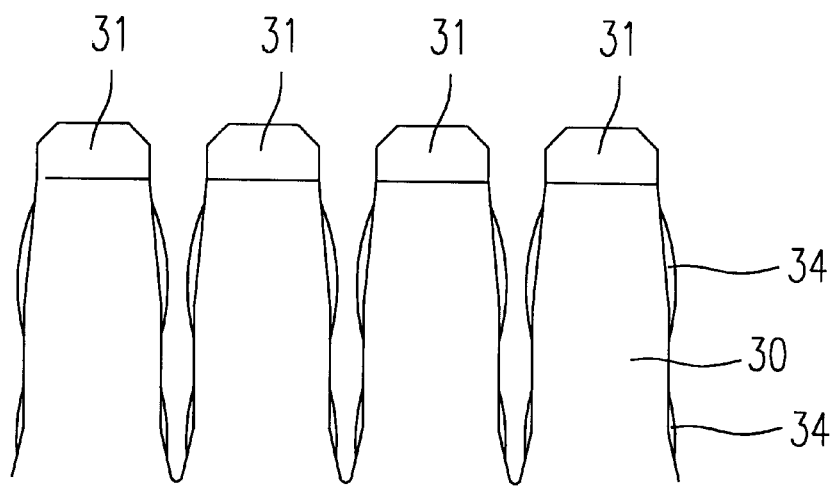
Figure 3E:
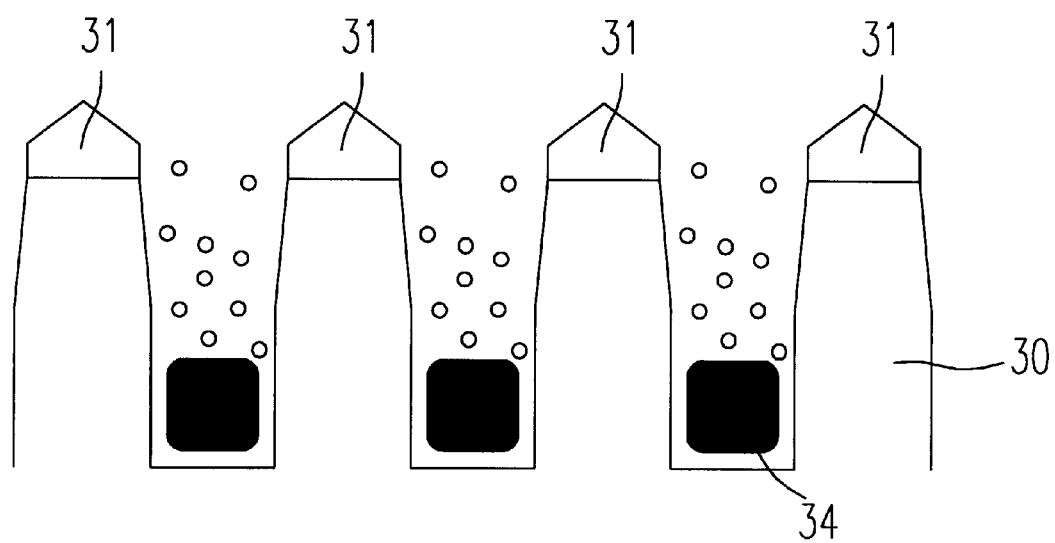

In FIG. 3(a), a dielectric layer 31 is formed on a silicon substrate 30, wherein the dielectric layer is made of silicon dioxide/silicon nitride/silicon dioxide or just silicon dioxide. This dielectric layer 31 is used as a hard mask for an etching process. In FIG. 3(b), a photoresist layer 32 is formed on the dielectric layer 31 and a pattern is defined on photoresist layer 32 by a photolithography process. A window of hard mask 33 on the dielectric layer 31 is formed by a dry anisotropic etching process, then the pattern is transferred to the silicon substrate 30 after removing the photoresist layer 32 as shown in FIG. 3(c). Thereafter, the part of the silicon substrate 30 which is not covered by the hard mask is etched by another dry etching process to obtain a deep trench as shown in FIGS. 3(d) and 3(e).

An oxide-rich-polymer 34 will remains at the sidewalls and the bottom of the trench after the dry anisotropic etching process. In order to clean this polymer, a gas is applied on the silicon substrate 30. In a preferred embodiment, the gas is a gaseous hydrofluoric acid applied to the trench for 15 seconds at room temperature and 1 atm.

Figure 3F:
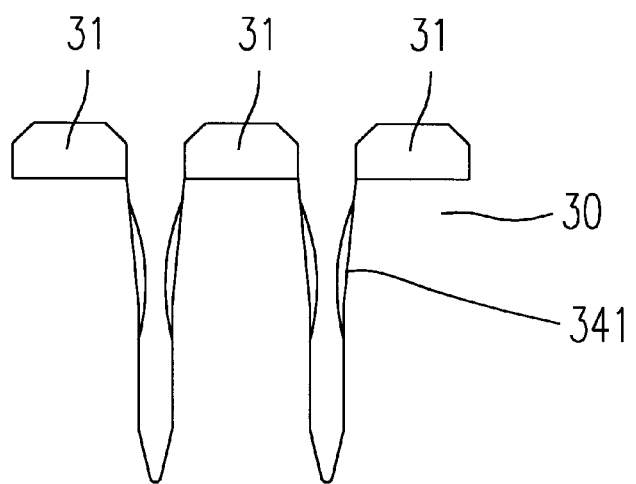
Figure 3G:
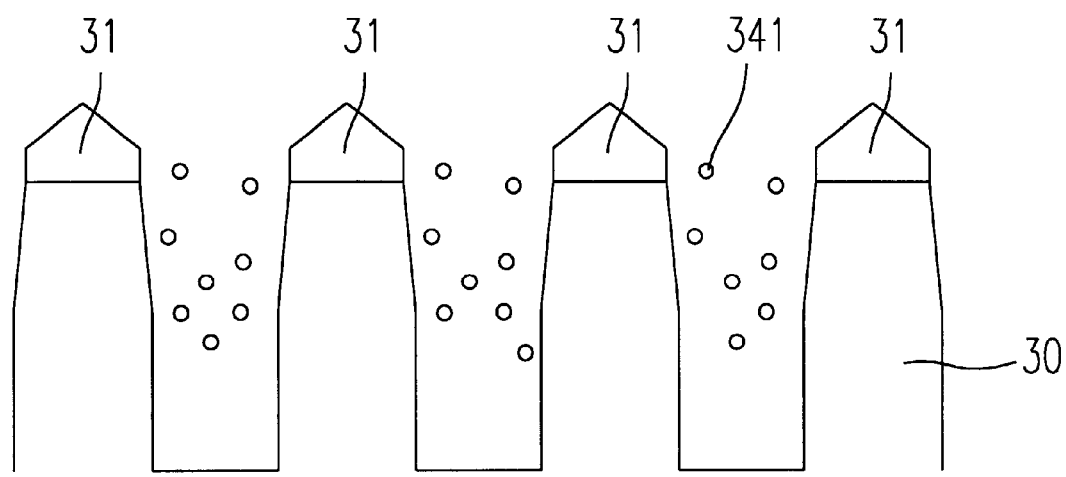

As shown in FIGS. 3(f) and 3(g), most of the polymer at the bottom of the trench are removed but some polymer 341 are still remained at the sidewalls of the trench. In order to completely remove the polymer remained in the trench, a buffer oxide etcher (BOE) containing a mixture of hydrofluoric acid and ammonium fluoride is applied to the trench to react with the remained polymer 341.

In the prior art, the method for cleaning the polymer is just a wet etching process. The buffer oxide etcher (BOE) of the wet etching process must enter the bottom of the trench to react with the polymer and is then removed by a spin dryer. However, when the hole size of the trench is smaller, the buffer oxide etcher can not enter or be removed from the trench easily so that it becomes more difficult to completely remove the polymer at the bottom of the deep trench.

In the present invention, a gaseous hydrofluoric acid is applied to the trench to clean the polymer and then a wet etching process is performed to remove the remaining polymer in the trench.

Because the gas can enter the small hole of the deep trench easily, this method can solve the problem encountered in the prior art. Therefore, this present invention can effectively improve the quality of a DRAM and increase the yield of the product.

It should be understood that the scope of the present invention is not limited to the particular embodiment disclosed herein as the best mode contemplated for carrying the present invention. On the contrary, it is intended to cover various modifications and similar arrangements included within the spirit and scope of the appended claims which are to be accorded with the broadest interpretation so as to encompass all such modifications and similar structures.

What is claimed is:

1. A method for removing a polymer formed in a trench of a semiconductor after said trench is thoroughly produced during the process of manufacturing a capacitor comprising steps of:
   introducing a gas into said trench at room temperature and atmospheric pressure for reacting with said polymer to form a reactant;
   vaporizing said reactant in said trench;
   removing said vaporized reactant from said trench; and
   removing said polymer remaining in said trench by a wet etching process using a buffer oxide etcher (BOE) as an etching agent.

2. The method as set forth in claim 1 wherein said buffer oxide etcher is a solution containing hydrofluoric acid and ammonium fluoride.

3. The method as set forth in claim 1 wherein said gas is a gaseous hydrofluoric acid.

4. The method as set forth in claim 3 wherein said gas is applied to said trench for 15 seconds.

5. The method as set forth in claim 1 wherein said trench is produced by steps of:
   providing a silicon substrate;
   forming a dielectric layer on said silicon substrate to serve as a hard mask;
   forming a photoresist layer on said dielectric layer;
   etching a portion of said photoresist layer to expose a portion of said hard mask;
   removing said exposed hard mask to expose a corresponding portion of said silicon substrate;
   removing said photoresist layer remaining on said dielectric layer; and
   removing said exposed portion of said silicon substrate to form said trench.

6. The method as set forth in claim 5 wherein said exposed portion of said silicon substrate is removed by a dry etching process.

7. The method as set forth in claim 6 wherein said process is a dry anisotropic etching process.

8. A method for removing a polymer formed in a trench of a semiconductor after said trench is thoroughly produced during the process of manufacturing a capacitor comprising steps of:
   introducing a gaseous hydrofluoric acid into said trench at room temperature and atmospheric pressure for reacting with said polymer to form a reactant;
   vaporizing said reactant in said trench;
   removing said vaporized reactant from said trench; and
   removing said polymer remaining in said trench by a wet etching process using a buffer oxide etcher (BOE) as an etching agent.

9. The method as set forth in claim 8 wherein said trench is produced by steps of:
   providing a silicon substrate;
   forming a dielectric layer on said silicon substrate to serve as a hard mask;
   forming a photoresist layer on said dielectric layer;
   etching a portion of said photoresist layer to expose a portion of said hard mask;
   removing said exposed hard mask to expose a corresponding portion of said silicon substrate;
   removing said photoresist layer remaining on said dielectric layer; and
   removing said exposed portion of said silicon substrate to form said trench.

10. The method as set forth in claim 8 wherein said reactant is vaporized by a heating process.

11. The method as set forth in claim 8 wherein said buffer oxide etcher is a solution containing hydrofluoric acid and ammonium fluoride.

12. The method as set forth in claim 9 wherein said exposed portion of said silicon substrate is removed by a dry etching process.

13. The method as set forth in claim 12 said process is a dry anisotropic etching process.

* * * * *